(12) United States Patent
Bae

(10) Patent No.: US 7,710,818 B2
(45) Date of Patent: May 4, 2010

(54) SEMICONDUCTOR MEMORY DEVICE HAVING LOW JITTER SOURCE SYNCHRONOUS INTERFACE AND CLOCKING METHOD THEREOF

(75) Inventor: Seung-Jun Bae, Daejeon (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 168 days.

(21) Appl. No.: 11/950,279

(22) Filed: Dec. 4, 2007

(65) Prior Publication Data

US 2008/0130397 A1      Jun. 5, 2008

(30) Foreign Application Priority Data

Dec. 5, 2006    (KR) .................. 10-2006-0122585

(51) Int. Cl.
  *G11C 8/00*    (2006.01)
(52) U.S. Cl. .................. 365/233.11; 365/191; 365/194; 365/233.1
(58) Field of Classification Search .................. 365/194, 365/191, 233.1, 233.11
  See application file for complete search history.

(56) References Cited

U.S. PATENT DOCUMENTS 6,078,533 A * 6/2000 Lee ............................ 365/194
6,151,271 A * 11/2000 Lee ........................ 365/230.03
6,262,921 B1 * 7/2001 Manning .................... 365/194
6,434,083 B2 * 8/2002 Lim ....................... 365/233.12
6,853,226 B2 * 2/2005 Kwak et al. ................. 327/159
2002/0075980 A1   6/2002 Tang et al.

FOREIGN PATENT DOCUMENTS

| JP | 2002-049438 | 2/2002 |
| JP | 2003-337742 | 11/2003 |
| JP | 2004-120433 | 4/2004 |
| KR | 2006-0063246 | 6/2006 |

OTHER PUBLICATIONS

English language abstract of Japanese Publication No. 2004-120433.
English language abstract of Korean Publication No. 2006-0063246.

\* cited by examiner

*Primary Examiner*—Pho M. Luu
(74) *Attorney, Agent, or Firm*—Muir Patent Consulting, PLLC

(57) ABSTRACT

Provided are a semiconductor memory device having a source synchronous interface capable of reducing jitter while minimizing overhead and a clocking method thereof. The semiconductor memory device comprises a phase locked loop (PLL) circuit receiving a first external clock signal for a command and address signal and generating a first internal clock signal, a first delay locked loop (DLL) circuit receiving a second external clock signal for predetermined bits of data and the first internal clock signal and generating a second internal clock signal locked to the second external clock signal, and a second DLL circuit receiving a third external clock signal for the remaining bits of the data and the first internal clock signal and generating a third internal clock signal locked to the third external clock signal.

17 Claims, 4 Drawing Sheets

SEMICONDUCTOR MEMORY DEVICE HAVING LOW JITTER SOURCE SYNCHRONOUS INTERFACE AND CLOCKING METHOD THEREOF

CROSS-REFERENCE TO RELATED PATENT APPLICATION

This application claims the benefit of Korean Patent Application No. 10-2006-0122585, filed on Dec. 5, 2006, in the Korean Intellectual Property Office, the disclosure of which is incorporated herein in its entirety by reference.

BACKGROUND OF THE INVENTION

1. Field of the Invention

The present invention relates to a semiconductor memory device having a source synchronous interface, and more particularly, to a semiconductor memory device having a low jitter source synchronous interface and a clocking method for reducing jitter.

2. Description of the Related Art

When data is transmitted between semiconductor devices, jitter restrains the transmission speed. To solve this problem, a source synchronous interface is used, which is generally referred to as forwarded clocking. A synchronous interface technique is disclosed in US 2002/0075980 A1.

FIG. 1 illustrates a conventional source synchronous interface method. Referring to FIG. 1, a transmitter TX 100 transmits a clock signal CLK along with data DATA to a receiver RX 110. In the transmitter 110, a circuit 11 transmitting the data DATA and a circuit 13 transmitting the clock signal CLK have the same configuration. A line transferring the data DATA and a line transferring the clock signal CLK are constructed in the same manner on a PCB.

The receiver 110 uses a phase locked loop (PLL) or a delay locked loop (DLL) 17 in order to perform a locking operation, generate a multi-phase clock signal and generate a high-frequency clock signal when receiving the clock signal CLK and generating an internal clock signal ICLK. A data receiving circuit 15 included in the receiver 100 receives the data DATA in response to the internal clock signal ICLK.

When the circuit illustrated in FIG. 1 is a memory system, the transmitter 100 corresponds to a memory controller and the receiver 110 corresponds to a memory device.

In the aforementioned source synchronous interface method, when jitter is applied to the line transferring the data DATA, similar jitter is applied to the line transferring the clock signal CLK. The influence of jitter is eliminated when the receiver 100 samples the data DATA using the received clock signal CLK. Accordingly, a data transfer rate may be increased.

When a PLL is used for a source synchronous interface, common mode jitter between data and a clock signal is removed only at frequencies lower than the bandwidth of the PLL although jitter of a clock signal having a high-frequency higher than the bandwidth of the PLL is eliminated. When a DLL is used for the source synchronous interface, the common mode jitter between the data and the clock signal is removed even at frequencies higher than the bandwidth of the DLL. However, a phase difference between the data and the clock signal may be generated due to a delay time of the DLL. This may cause jitter larger than the jitter generated when the PLL is used.

In other words, when a PLL is used at frequencies higher than a predetermined high frequency and a DLL is used at frequencies lower than the predetermined high frequency in the source synchronous interface, jitter between the data and the clock signal can be reduced at the receiver side.

SUMMARY OF THE INVENTION

The present invention provides a semiconductor memory device having a source synchronous interface, which is able to reduce jitter while minimizing overhead.

The present invention also provides a clocking method capable of reducing jitter in a semiconductor memory device having a source synchronous interface.

According to an aspect of the present invention, there is provided a semiconductor memory device comprising a PLL circuit receiving a first external clock signal for a command and address signal and generating a first internal clock signal, a first DLL circuit receiving a second external clock signal for predetermined bits of data and the first internal clock signal and generating a second internal clock signal locked to the second external clock signal, and a second DLL circuit receiving a third external clock signal for the remaining bits of the data and the first internal clock signal and generating a third internal clock signal locked to the third external clock signal.

The semiconductor memory device may further comprise a first data receiver receiving the predetermined bits of the data in response to the second internal clock signal, a second data receiver receiving the remaining bits of the data in response to the third internal clock signal, and a command/address receiver receiving the command and address signal in response to the first external clock signal.

According to another aspect of the present invention, there is provided a semiconductor memory device comprising a PLL circuit receiving a first external clock signal for a command and address signal and generating a first internal clock signal, and a DLL circuit receiving a second external clock signal for data and the first internal clock signal and generating a second internal clock signal locked to the second external clock signal.

The semiconductor memory device may further comprise a data receiver receiving the data in response to the second internal clock signal, and a command/address receiver receiving the command and address signal in response to the first external clock signal.

According to another aspect of the present invention, there is provided a clocking method for a source synchronous interface of a semiconductor memory device, comprising: receiving a first external clock signal for a command and address signal and generating a first internal clock signal using a PLL circuit; receiving a second external clock signal for predetermined bits of data and the first internal clock signal and generating a second internal clock signal locked to the second external clock signal using a first DLL circuit; and receiving a third external clock signal for the remaining bits of the data and the first internal clock signal and generating a third internal clock signal locked to the third external clock signal using a second DLL circuit.

The clocking method may further comprises receiving the predetermined bits of the data in response to the second internal clock signal, receiving the remaining bits of the data in response to the third internal clock signal, and receiving the command and address signal in response to the first external clock signal.

According to another aspect of the present invention, there is provided a clocking method for a source synchronous interface of a semiconductor memory device, comprising: receiving a first external clock signal for a command and address signal and generating a first internal clock signal using a PLL circuit; and receiving a second external clock signal for data and the first internal clock signal and generating a second internal clock signal locked to the second external clock signal using a DLL circuit.

The clocking method may further comprise receiving the data in response to the second internal clock signal, and receiving the command and address signal in response to the first external clock signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
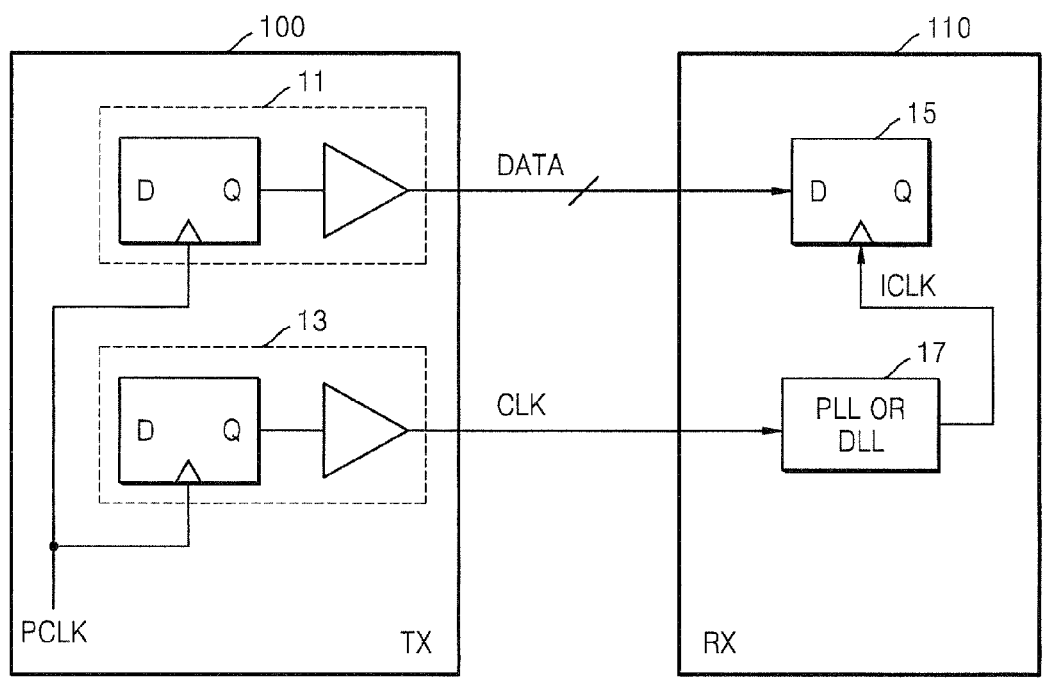
FIG. 1 illustrates a conventional source synchronous interface method.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

Figure 2:
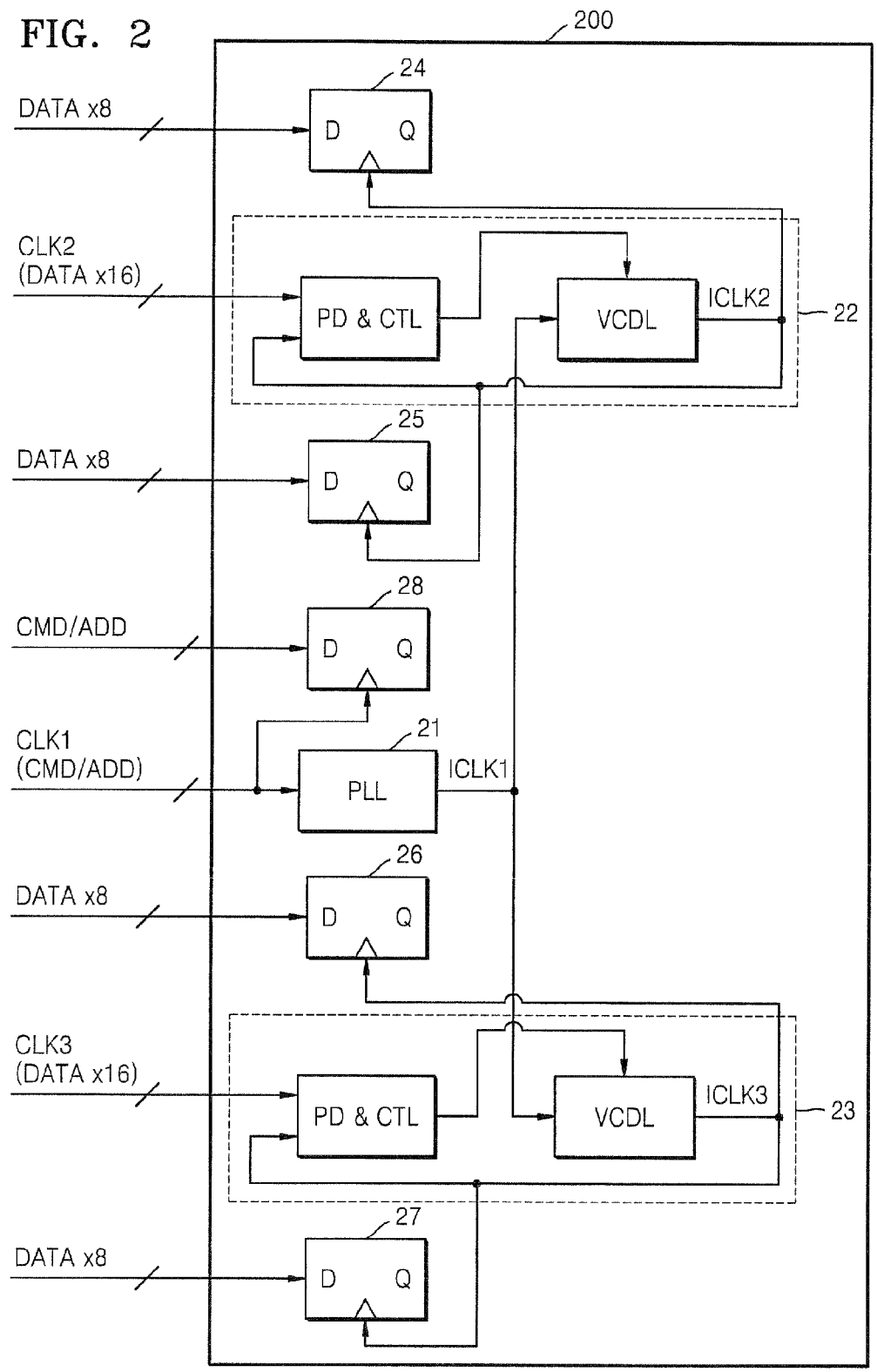
FIG. 2 is a block diagram of a source synchronous interface of a semiconductor memory device according to an embodiment of the present invention.

FIG. 2 is a block diagram of a source synchronous interface of a semiconductor memory device 200 according to an embodiment of the present invention. The semiconductor memory device 200 receives 32-bit data DATA, external clock signals CLK2 and CLK3 for source synchronous, and an external clock signal CLK1 for a command and address signal CMD/ADD in the present embodiment. The semiconductor memory device 200 receives the external clock signals CLK2 and CLK3 for every 16 bits DATAx16 of the 32-bit data.

Referring to FIG. 2, the semiconductor memory device 200 includes a single PLL circuit 21 and two DLL circuits 22 and 23 and is constructed based on a clocking method according to the present invention.

The PLL circuit 21 receives the first external clock signal CLK1 for the command and address signal CMD/ADD and generates a first internal clock signal ICLK1. The first DLL circuit 22 receives the second external clock signal CLK2 for more significant 16 bits DATAx16 of the 32-bit data and the first internal clock signal ICLK1 and generates a second internal clock signal ICLK2 locked to the second external clock signal CLK2. The second DLL circuit 23 receives the third external clock signal CLK3 for less significant 16 bits DATAx16 of the 32-bit data and the first internal clock signal ICLK1 and generates a third internal clock signal ICLK3 locked to the third external clock signal CLK3.

The semiconductor memory device 200 further includes first data receivers 24 and 25 receiving the more significant 16 bits DATAx16 of the 32-bit data in response to the second internal clock signal ICLK2, and second data receivers 26 and 27 receiving the less significant 16 bits DATAx16 of the 32-bit data in response to the third internal clock signal ICLK3. The data receiver 24 receives 8 bits of the more significant 16 bits DATAx16 and the data receiver 25 receives the remaining 8 bits of the more significant 16 bits DATAx16. The data receiver 26 receives 8 bits of the less significant 16 bits DATAx16 and the data receiver 27 receives the remaining 8 bits of the less significant 16 bits DATAx16.

The semiconductor memory device 200 further includes a command/address receiver 28 receiving the command/address signal CMD/ADD in response to the first external clock signal CLK1.

It is preferable that a pin through which the first external clock signal CLK1 for the command/address signal CMD/ADD is located at the middle of the semiconductor memory device 200. That is, it is preferable that pins through which the more significant 16 bits DATAx16 of the 32-bit data are input and a pin through which the second external clock signal CLK2 is input are arranged at one side of the pin through the first external clock signal CLK1 is input, and pins through which the less significant 16 bits DATAx16 of the 32-bit data and a pin through which the third external clock signal CLK3 is input are arranged at the other side of the first external clock CLK1 input pin.

As described above, the semiconductor memory device 200 includes the single PLL circuit 21 and the two DLL circuits 22 and 23 and uses the output clock signal of the PLL circuit 21, that is, the first internal clock signal ICLK1, as the input clock signal of the two DLL circuits 22 and 23. Accordingly, RF jitter is removed from the output clock signal of the PLL circuit 21, that is, the first internal clock signal ICLK1, according to characteristic of the PLL circuit 21. Furthermore, the DLL circuits 22 and 23 output the second and third internal clock signals ICLK2 and ICLK3 from which RF jitter has been removed because the output clock signal ICLK1 of the PLL circuit 21 is used as the input clock signal of the DLL circuits 22 and 23. The RF jitter-free output clock signal ICLK2 of the DLL circuit 22 is used a sampling clock signal of the first data receivers 24 and 25. The DLL circuit 22 compares the second external clock signal CLK2 to the RF jitter-free output clock signal ICLK2 and locks the two clock signals. Accordingly, the output clock signal ICLK2 of the DLL circuit 22 tracks jitter of the second external clock signal CLK2 within the bandwidth of the DLL circuit 22. As a result, jitter of the more significant 16 bits of the 32-bit data is removed within the bandwidth of the DLL circuit 22.

The RF jitter-free output clock signal ICLK3 of the DLL circuit 23 is used a sampling clock signal of the second data receivers 26 and 27. The DLL circuit 23 compares the third external clock signal CLK3 to the RF jitter-free output clock signal ICLK3 and locks the two clock signals. Accordingly, the output clock signal ICLK3 of the DLL circuit 23 tracks jitter of the third external clock signal CLK3 within the bandwidth of the DLL circuit 23. As a result, jitter of the less significant 16 bits of the 32-bit data is removed within the bandwidth of the DLL circuit 23.

While the semiconductor memory device 200 includes the single PLL circuit 21 and the two DLL circuits 22 and 23 in the present embodiment, the semiconductor memory device 200 can include a single PLL circuit and a single DLL circuit if required.

Figure 3:
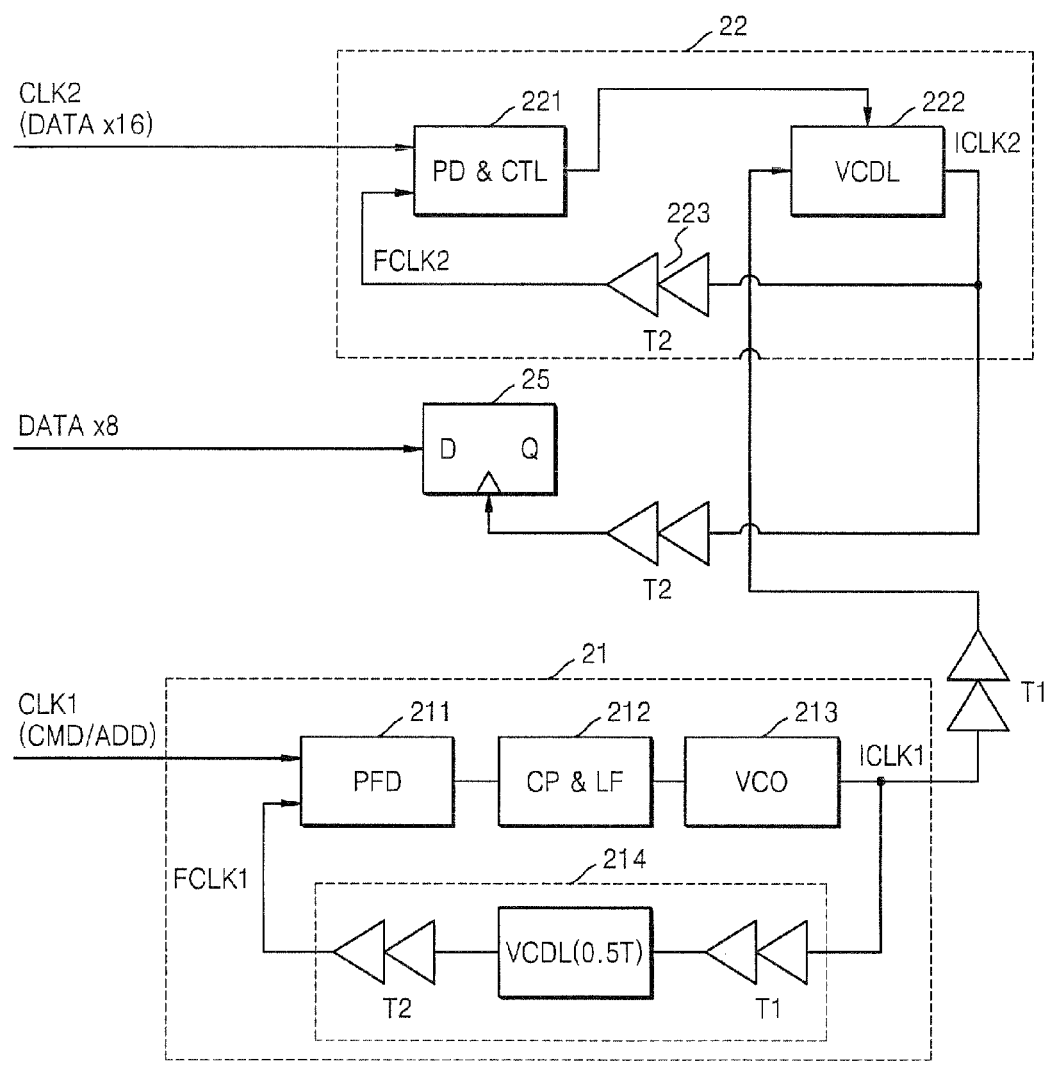
FIG. 3 illustrates a PLL circuit and a DLL circuit illustrated in FIG. 2.

FIG. 3 illustrates the PLL circuit 21 and the DLL circuit 22 illustrated in FIG. 2 in more detail. The DLL circuit 23 has the same configuration as the DLL circuit 22 so that the DLL circuit 23 is not illustrated in FIG. 3.

Referring to FIG. 3, the PLL circuit 21 includes a phase frequency detector 211 detecting a phase difference and a frequency difference between the first external clock signal CLK1 and a first feedback clock signal FCLK1, a charge pump and loop filter 212 generating a voltage control signal in response to the output signal of the phase frequency detector 211, a voltage controlled oscillator 213 generating the first internal clock signal ICLK1 in response to the voltage control signal, and a first compensation delay circuit 214 delaying the first internal clock signal ICLK1 and outputting the first feedback clock signal FCLK1.

The DLL circuit 22 21 includes a phase detection and control unit 221 detecting a phase difference between the second external clock signal CLK2 and a second feedback clock signal FCLK2 and generating a control signal, a voltage controlled delay line 222 that is controlled by the control signal, receives the first internal clock signal ICLK1 and generates the second internal clock signal ICLK2, and a second compensation delay circuit 223 delaying the second internal clock signal ICLK2 and outputting the second feedback clock signal FCLK2.

The first compensation delay circuit 214 included in the PLL circuit 21 is a replica of a path (having a delay T1) from an output terminal of the voltage controlled oscillator 213 to an input terminal of the voltage controlled delay line 222, the voltage controlled delay line 222, and a path (having a delay T2) from an output terminal of the voltage controlled delay line 222 to a clock input terminal of the data receiver 25.

Accordingly, a delay of the first compensation delay circuit 214 is substantially equal to the sum of the delay T1 of the path from the output terminal of the voltage controlled oscillator 213 to the input terminal of the voltage controlled delay line 222, a delay 0.5 T in the voltage controlled delay line 222, and the delay T2 of the path from the output terminal of the voltage controlled delay line 222 to the clock input terminal of the data receiver 25.

The second compensation delay circuit 223 included in the DLL circuit 22 is a replica of the path from the output terminal of the voltage controlled delay line 222 to the clock input terminal of the data receiver 25. Accordingly, a delay of the second compensation delay circuit 223 is substantially equal to the delay T2 of the path from the output terminal of the voltage controlled delay line 222 to the clock input terminal of the data receiver 25.

The DLL circuit 23, which is not illustrated in FIG. 2, has the same configuration as the DLL circuit 22 so that explanation thereof is omitted.

When the semiconductor memory device includes the single PLL circuit 21 and two DLL circuits 22 and 23, a chip area and overhead of power consumption may increase. To reduce the overhead, the semiconductor memory device according to the present invention performs coarse locking using the PLL circuit 21 and carries out fine locking using the DLL circuits 22 and 233. In this case, the DLL circuits 22 and 23 can be constructed in a simple structure, and thus the overhead is reduced.

Figure 4A:
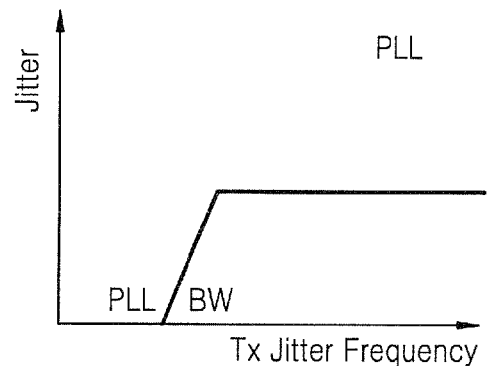
FIG. 4A is a graph illustrating jitter characteristic in a conventional source synchronous interface using a single PLL circuit alone.
Figure 4B:
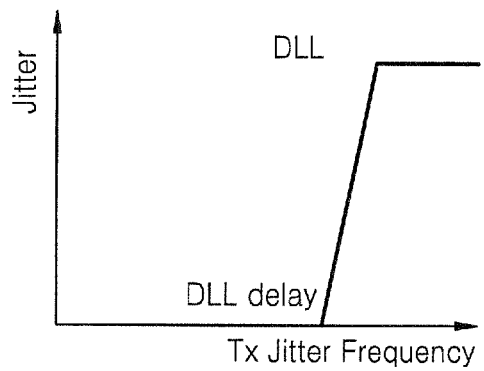
FIG. 4B is a graph illustrating jitter characteristic in a conventional source synchronous interface using a single DLL circuit alone.
Figure 4C:
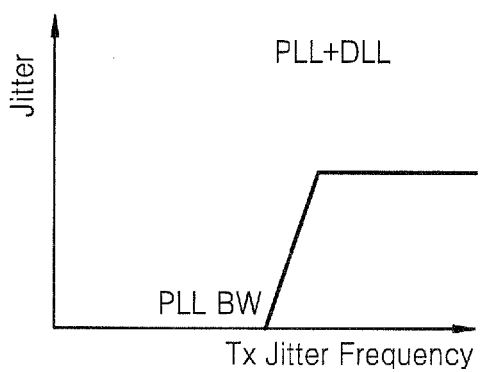
FIG. 4C is a graph illustrating jitter characteristic in a source synchronous interface using both a PLL circuit and a DLL circuit.

FIG. 4A is a graph illustrating jitter characteristic in a conventional source synchronous interface using a single PLL circuit alone, FIG. 4B is a graph illustrating jitter characteristic in a conventional source synchronous interface using a single DLL circuit alone, and FIG. 4C is a graph illustrating jitter characteristic in a source synchronous interface using both a PLL circuit and a DLL circuit. In FIGS. 4A, 4B and 4C, the horizontal axes represent a jitter frequency in a transmitter TX, that is, a memory controller, and the vertical axes represent a jitter difference between data and a clock signal in a receiver RX, that is, a memory device. As the jitter frequency becomes close to 0, jitter becomes smaller.

As described above, the semiconductor memory device using a source synchronous interface can reduce jitter while decreasing overhead.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
a phase locked loop (PLL) circuit receiving a first external clock signal for a command and address signal and generating a first internal clock signal;
a first delay locked loop (DLL) circuit receiving a second external clock signal for predetermined bits of data and the first internal clock signal and generating a second internal clock signal locked to the second external clock signal; and
a second DLL circuit receiving a third external clock signal for the remaining bits of the data and the first internal clock signal and generating a third internal clock signal locked to the third external clock signal.

2. The semiconductor memory device of claim 1, further comprising:
a first data receiver receiving the predetermined bits of the data in response to the second internal clock signal; and
a second data receiver receiving the remaining bits of the data in response to the third internal clock signal.

3. The semiconductor memory device of claim 2, wherein the PLL circuit comprises:
a phase frequency detector detecting a phase difference and a frequency difference between the first external clock signal and a first feedback clock signal;
a charge pump and loop filter generating a voltage control signal in response to the output signal of the phase frequency detector;
a voltage controlled oscillator generating the first internal clock signal in response to the voltage control signal; and
a first compensation delay circuit delaying the first internal clock signal and outputting the first feedback clock signal,
the first DLL circuit comprises:
a first phase detection and control unit detecting a phase difference between the second external clock signal and a second feedback clock signal and generating a first control signal;
a first voltage controlled delay line controlled by the first control signal, receiving the first internal clock signal and generating the second internal clock signal; and
a second compensation delay circuit delaying the second internal clock signal and outputting the second feedback clock signal, and
a delay in the first compensation delay circuit is substantially equal to the sum of a delay in a path from an output terminal of the voltage controlled oscillator to an input terminal of the first voltage controlled delay line, a delay in the first voltage controlled delay line, and a delay in a path from the output terminal of the first voltage controlled delay line to a clock input terminal of the first data receiver.

4. The semiconductor memory device of claim 3, wherein a delay in the second compensation delay circuit is substantially equal to the delay in the path from the output terminal of the first voltage controlled delay line to the clock input terminal of the first data receiver.

5. The semiconductor memory device of claim 3, wherein the second DLL circuit comprises:
   a second phase detection and control unit detecting a phase difference between the third external clock signal and a third feedback clock signal and generating a second control signal;
   a second voltage controlled delay line controlled by the second control signal, receiving the first internal clock signal and generating the third internal clock signal; and
   a third compensation delay circuit delaying the third internal clock signal and outputting the third feedback clock signal, and
   a delay of the third compensation delay circuit is substantially equal to the delay in a path from an output terminal of the second voltage controlled delay line to a clock input terminal of the second data receiver.

6. The semiconductor memory device of claim 3, wherein the first compensation delay circuit is a replica of the path from the output terminal of the voltage controlled oscillator to the input terminal of the first voltage controlled delay line, the first voltage controlled delay line, and the path from the output terminal of the first voltage controlled delay line to the clock input terminal of the first data receiver.

7. The semiconductor memory device of claim 3, wherein the second compensation delay circuit is a replica of the path from the output terminal of the first voltage controlled delay line to the clock input terminal of the first data receiver.

8. The semiconductor memory device of claim 1, further comprising a command/address receiver receiving the command and address signal in response to the first external clock signal.

9. A semiconductor memory device comprising:
   a PLL circuit receiving a first external clock signal for a command and address signal and generating a first internal clock signal;
   a DLL circuit receiving a second external clock signal for data and the first internal clock signal and generating a second internal clock signal locked to the second external clock signal,
   wherein the PLL circuit comprises:
   a phase frequency detector detecting a phase difference and a frequency difference between the first external clock signal and a first feedback clock signal;
   a charge pump and loop filter generating a voltage control signal in response to the output signal of the phase frequency detector;
   a voltage controlled oscillator generating the first internal clock signal in response to the voltage control signal; and
   a first compensation delay circuit delaying the first internal clock signal and outputting the first feedback clock signal, the DLL circuit comprises:
   a phase detection and control unit detecting a phase difference between the second external clock signal and a second feedback clock signal and generating a first control signal;
   a voltage controlled delay line controlled by the first control signal, receiving the first internal clock signal and generating the second internal clock signal; and
   a second compensation delay circuit delaying the second internal clock signal and outputting the second feedback clock signal, and
   a delay in the first compensation delay circuit is substantially equal to the sum of a delay in a path from an output terminal of the voltage controlled oscillator to an input terminal of the voltage controlled delay line, a delay in the voltage controlled delay line, and a delay in a path from the output terminal of the voltage controlled delay line to a clock input terminal of the data receiver.

10. The semiconductor memory device of claim 9, further comprising:
    a data receiver receiving the data in response to the second internal clock signal.

11. The semiconductor memory device of claim 9, further comprising a command/address receiver receiving the command and address signal in response to the first external clock signal.

12. The semiconductor memory device of claim 9, wherein a delay of the second compensation delay circuit is substantially equal to the delay in the path from the output terminal of the voltage controlled delay line to the clock input terminal of the data receiver.

13. The semiconductor memory device of claim 9, wherein the first compensation delay circuit is a replica of the path from the output terminal of the voltage controlled oscillator to the input terminal of the voltage controlled delay line, the voltage controlled delay line, and the path from the output terminal of the voltage controlled delay line to the clock input terminal of the data receiver.

14. The semiconductor memory device of claim 9, wherein the second compensation delay circuit is a replica of the path from the output terminal of the voltage controlled delay line to the clock input terminal of the data receiver.

15. A clocking method for a source synchronous interface of a semiconductor memory device, comprising:
    receiving a first external clock signal for a command and address signal and generating a first internal clock signal using a PLL circuit;
    receiving a second external clock signal for predetermined bits of data and the first internal clock signal and generating a second internal clock signal locked to the second external clock signal using a first DLL circuit; and
    receiving a third external clock signal for the remaining bits of the data and the first internal clock signal and generating a third internal clock signal locked to the third external clock signal using a second DLL circuit.

16. The clocking method of claim 15, further comprising;
    receiving the predetermined bits of the data in response to the second internal clock signal; and
    receiving the remaining bits of the data in response to the third internal clock signal.

17. The clocking method of claim 15, further comprising receiving the command and address signal in response to the first external clock signal.

* * * * *